US012588291B2

(12) United States Patent
Lin et al.

(10) Patent No.: US 12,588,291 B2
(45) Date of Patent: Mar. 24, 2026

(54) SUBSTRATES INCLUDING MICRO-STRUCTURED THIN FILM CAPACITORS

(71) Applicant: Intel Corporation, Santa Clara, CA (US)

(72) Inventors: Chun-Hao Lin, Chandler, AZ (US); Teng Sun, Chandler, AZ (US); Yuxin Fang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/333,860

(22) Filed: Jun. 13, 2023

(65) Prior Publication Data

US 2024/0421144 A1 Dec. 19, 2024

(51) Int. Cl.
H10D 86/85 (2025.01)
H01G 4/33 (2006.01)

(52) U.S. Cl.
CPC ............... H10D 86/85 (2025.01); H01G 4/33 (2013.01)

(58) Field of Classification Search
CPC ................................ H10D 86/85; H01G 4/33
See application file for complete search history.

(56) References Cited

U.S. PATENT DOCUMENTS 6,765,287 B1 7/2004 Lin
8,502,293 B2 8/2013 Lindert

| | | |
|---|---|---|
| 8,692,368 B2 | 4/2014 | Pan et al. |
| 9,129,817 B2 | 9/2015 | Elsherbini et al. |
| 9,691,839 B2 | 6/2017 | Lindert et al. |
| 10,283,443 B2 | 5/2019 | Liao et al. |
| 10,998,261 B2 | 5/2021 | Kong et al. |
| 11,276,684 B2 * | 3/2022 | Chen ................... H01L 23/5223 |
| 11,538,748 B2 * | 12/2022 | Duan ...................... H10D 1/716 |
| 12,034,039 B2 * | 7/2024 | Khor ...................... H10D 1/043 |
| 2007/0132063 A1 | 6/2007 | Min et al. |
| 2008/0247116 A1 | 10/2008 | Kawano et al. |
| 2009/0237900 A1 | 9/2009 | Origuchi et al. |
| 2010/0140743 A1 | 6/2010 | Sashida |
| 2010/0213572 A1 | 8/2010 | Ching et al. |
| 2010/0230806 A1 | 9/2010 | Huang et al. |
| 2011/0095349 A1 | 4/2011 | Hachisuka et al. |
| 2011/0304999 A1 | 12/2011 | Yu et al. |
| 2012/0161280 A1 | 6/2012 | Lindert |

(Continued)

FOREIGN PATENT DOCUMENTS

| | | |
|---|---|---|
| DE | 102016100856 B4 | 11/2020 |
| EP | 3916771 A1 | 12/2021 |

(Continued)

*Primary Examiner* — David Vu
*Assistant Examiner* — Brandon C Fox
(74) *Attorney, Agent, or Firm* — Akona IP PC

(57) ABSTRACT

Disclosed herein are microelectronic assemblies including strengthened glass cores, as well as related devices and methods. In some embodiments, a microelectronic substrate with an in situ capacitor, the capacitor may include a first conductive layer having first microstructures at a first surface, a second conductive layer on the first conductive layer and having second microstructures at a second surface, where the second microstructures vertically interlock with the first microstructures, and a high-k dielectric material between the first microstructures and the second microstructures.

16 Claims, 14 Drawing Sheets

(56)     References Cited

U.S. PATENT DOCUMENTS

| | | | |
|---|---|---|---|
| 2013/0037910 A1 | 2/2013 | Tzeng et al. | |
| 2013/0270676 A1 | 10/2013 | Lindert et al. | |
| 2014/0092524 A1 | 4/2014 | Kim et al. | |
| 2014/0217547 A1 | 8/2014 | Elsherbini et al. | |
| 2014/0264732 A1 | 9/2014 | Elsherbini et al. | |
| 2015/0221714 A1 | 8/2015 | Gu et al. | |
| 2016/0276324 A1* | 9/2016 | Lin | H01L 25/16 |
| 2017/0092412 A1 | 3/2017 | Manusharow et al. | |
| 2018/0344245 A1 | 12/2018 | Knickerbocker et al. | |
| 2018/0358292 A1 | 12/2018 | Kong et al. | |
| 2019/0123131 A1 | 4/2019 | Cervin et al. | |
| 2020/0051743 A1 | 2/2020 | Sounart et al. | |
| 2020/0105653 A1 | 4/2020 | Elsherbini et al. | |
| 2020/0176557 A1 | 6/2020 | Yin et al. | |
| 2020/0381420 A1 | 12/2020 | Chen et al. | |
| 2021/0011116 A1 | 1/2021 | Ainspan et al. | |
| 2021/0111166 A1 | 4/2021 | Zhang et al. | |
| 2021/0118794 A1 | 4/2021 | Ding et al. | |
| 2022/0392855 A1* | 12/2022 | Darmawikarta | H01L 25/16 |
| 2024/0404943 A1* | 12/2024 | Frost | H10D 1/692 |
| 2025/0046720 A1* | 2/2025 | Chen | H10D 84/212 |

FOREIGN PATENT DOCUMENTS

| | | | |
|---|---|---|---|
| WO | 2015192096 A2 | 12/2015 | |
| WO | 2018117111 A1 | 6/2018 | |

* cited by examiner 115-1

118-1 z-axis          x-axis y-axis 115-1

118-1 z-axis          x-axis y-axis 115-1

118-1 z-axis      x-axis y-axis 115-1

118-1 z-axis      x-axis y-axis 170-2

COMPUTING DEVICE - 2400

| PROCESSING DEVICE 2402 | COMMUNICATION CHIP 2412 |
| MEMORY 2404 | BATTERY/POWER 2414 |
| DISPLAY DEVICE 2406 | GPS DEVICE 2416 |
| AUDIO OUTPUT DEVICE 2408 | AUDIO INPUT DEVICE 2418 |
| OTHER OUTPUT DEVICE 2410 | OTHER INPUT DEVICE 2420 |

ANTENNA 2422

SUBSTRATES INCLUDING MICRO-STRUCTURED THIN FILM CAPACITORS

TECHNICAL FIELD

The present disclosure relates to techniques, methods, and apparatus directed to substrates having micro-structured thin film capacitors.

BACKGROUND

Electronic circuits when fabricated on a wafer of semiconductor material, such as silicon, are commonly called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system. Some ICs have specific functionalities, such as memory or processing. Some other ICs have multiple functionalities, such as a system-on-chip (SOC), in which all or most components of a computer or other electronic system are integrated into a single monolithic die.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3L are simplified cross-sectional views illustrating various manufacturing steps of an example microelectronic assembly according to some embodiments of the present disclosure.

DETAILED DESCRIPTION

Figure 1:
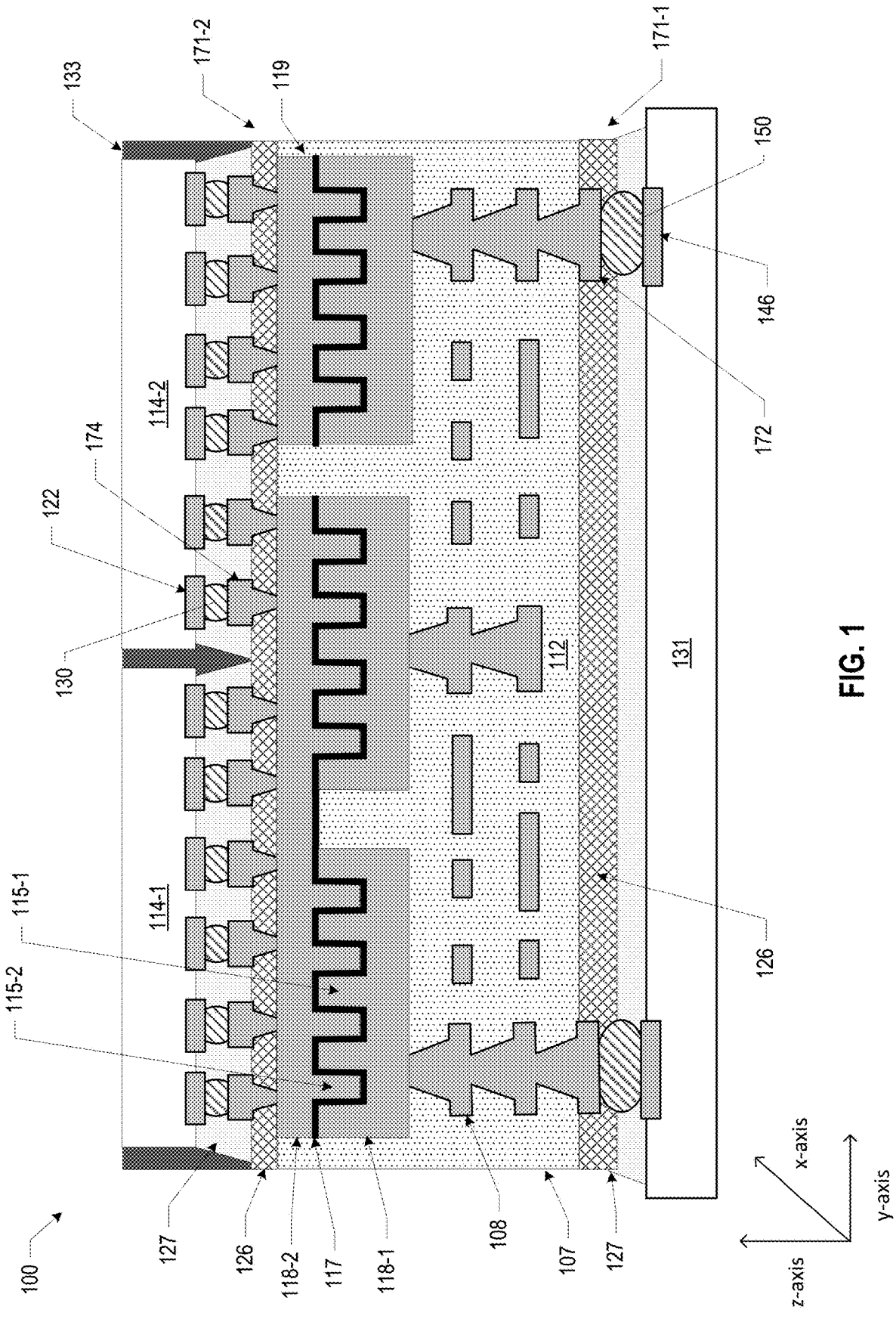
FIG. 1 is a schematic cross-sectional view of an example microelectronic assembly according to some embodiments of the present disclosure.

For purposes of illustrating IC packages described herein, it is important to understand phenomena that may come into play during assembly and packaging. The following foundational information may be viewed as a basis from which the present disclosure may be properly explained. Such information is offered for purposes of explanation only and, accordingly, should not be construed in a way that limits the broad scope of the present disclosure and its potential applications.

Capacitors are included in IC packages to supply current to dies during transient spikes in power demand and to minimize power supply noise. Power delivery requirements for server processors and other advanced processing platforms include an increasing demand for more capacitance adjacent to the dies to prevent voltage droop on voltage rails. Typically, IC packages include prefabricated capacitors that may be surface-mounted on a die or a circuit board. For example, IC packages may include die side capacitors (DSC) mounted on a backside of a die or land side capacitors (LSC) mounted on a circuit board. Surface-mounted capacitors are likely to increase latency of power delivery due to increased power trace distance, occupy limited surface area on the die and/or circuit board, and increase overall z-height (e.g., thickness) of the IC package. One conventional solution for incorporating capacitors is to build metal-insulator-metal (MIM) capacitors in the top dies as part of the voltage regulator circuitry necessary for the power delivery function of the IC package, but many dies cannot incorporate a sufficient number of MIM capacitors to meet capacitance demands of the power delivery network. Another conventional solution is to incorporate capacitors in a package substrate, which results in long electrical pathways from the capacitor to the die. Various ones of the embodiments disclosed herein may help achieve improved power efficiency with greater design flexibility, relative to conventional approaches. Yet another conventional solution for providing the needed decoupling capacitance is to integrate a capacitive layer into the substrate below the die. In situ fabricated thin film capacitors (TFC) in substrates tend to use high dielectric constant inorganic materials in the capacitors, although organic dielectric materials may also be used in specific applications. As used herein, in situ TFC refers to a TFC fabricated in and with the substrate, unlike an ex situ TFC that is fabricated independently of the substrate. Crystalline inorganic materials have high dielectric constant, but also requires high annealing temperature Amorphous dielectrics, such as organic polymers, generally do not require annealing but have dielectric constants that are relatively low, which leads to a lower capacitance value. In addition, the manufacturing processes for various such inorganic dielectric materials typically involve high annealing temperatures that are not compatible with electronic circuitry or materials used therewith, tending to severely limit the choice of materials available for fabricating in situ capacitors. Capacitors having a high aspect ratio with high capacitance applications that are more efficient and more easily integrated into a substrate of an IC package may be desired.

Accordingly, embodiments described herein are microelectronic assemblies including a substrate having a micro-structured capacitor (MSC) therein, as well as related devices and methods. In particular, a substrate may include an MSC, and the MSC may include a first conductive layer having first microstructures at a first surface, a second conductive layer on the first conductive layer, the second conductive layer having second microstructures at a second surface, where the first microstructures vertically interlock with the second microstructures, and a high-k dielectric layer between the first microstructures and the second microstructures.

An MSC may be formed in-situ using a lithography process on a glass carrier to greatly enhance capacitor thin film surface area. By using this in-situ fabrication process, an MSC may be fabricated directly below the die area, which eliminates the need for stacked vias that typically connect to LSC. Further, an MSC may be positioned closer to a die, which may enhance performance. By forming an MSC on a glass carrier, a higher annealing temperature may be achieved without affecting the electronic circuitry or materials in the substrate. Additionally, a glass carrier generally has lower average surface roughness than typical organic substrate, which is an important parameter for a TFC where a thinner film can lead to higher capacitance.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are stated in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of input/output (I/O) functions, arithmetic operations, pipelining of data, etc.).

In another example, the terms "package" and "IC package" are synonymous, as are the terms "die" and "IC die." Note that the terms "chip," "chiplet," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., metal oxide semiconductor (MOS) FETs (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 3A-3L), such a collection may be referred to herein without the letters (e.g., as "FIG. 3"). Similarly, if a collection of reference numerals designated with different numbers are present (e.g., 118-1, 118-2), such a collection may be referred to herein without the numbers (e.g., as "118").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

FIG. 1 is a schematic cross-sectional view of an example microelectronic assembly 100 according to some embodiments of the present disclosure. Microelectronic assembly 100 may include a substrate 112 having a in situ MSC 119. In particular, a substrate 112 may have a first surface 171-1 and an opposing second surface 171-2 with an MSC 119 at the second surface 171-2 adjacent to dies 114-1, 114-2. The MSC 119 may include a first conductive layer 118-1 having first microstructures 115-1, a second conductive layer 118-2 having second microstructures 115-2, where the second microstructures 115-2 are complementary to and vertically interlock with the first microstructures 115-1, and a high-k dielectric material 117 between the first microstructures 115-1 and the second microstructures 115-2. As used herein, "interlock" refers to parts that fit into each other (e.g., parts that complement and coordinate with each other such that the parts may be interconnected or joined closely). The terms "interlocked," "interdigitated," and "interconnected" may be used interchangeably herein.

Figure 2A:
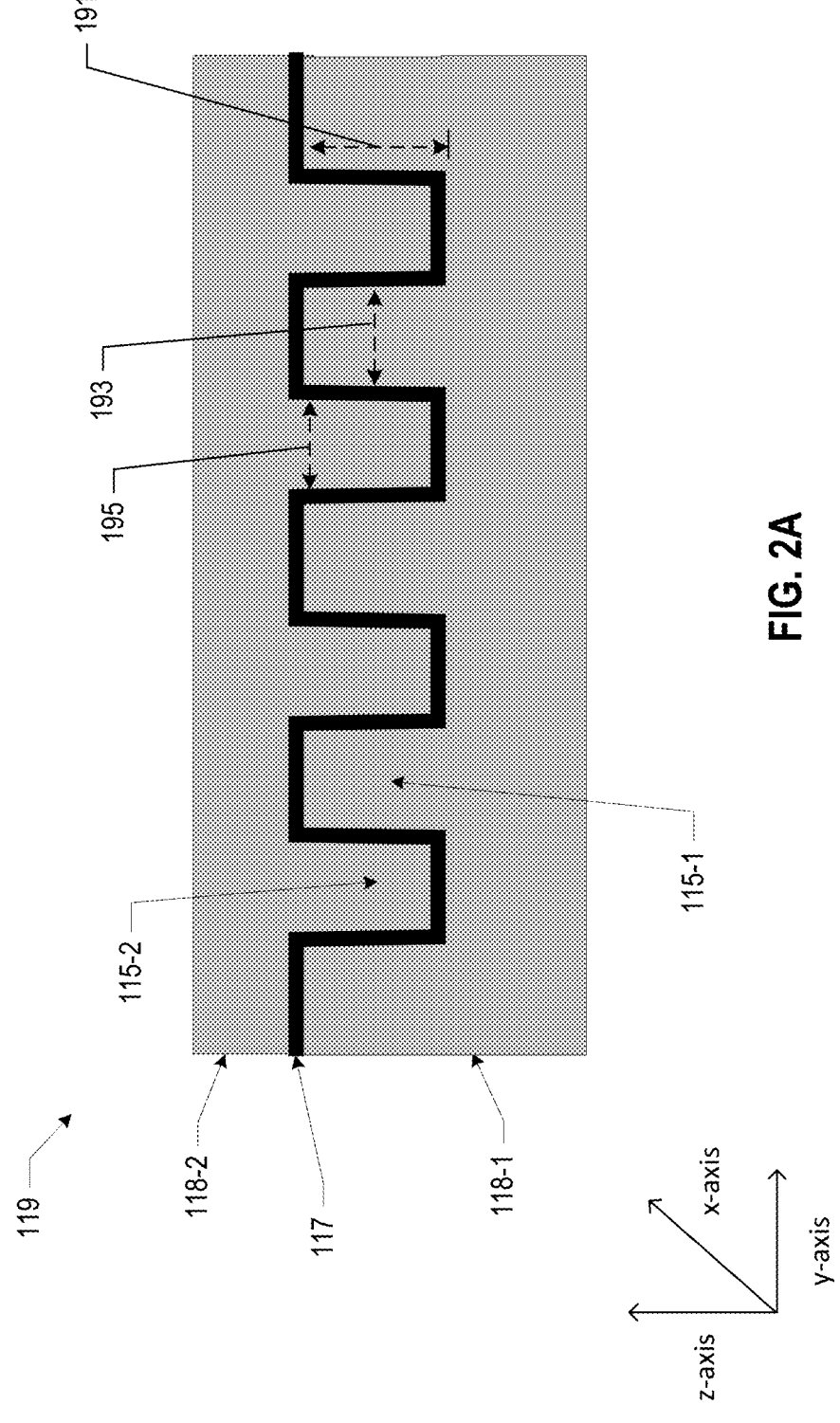
FIG. 2A is a schematic cross-sectional view of a capacitor in a portion of an example microelectronic assembly according to some embodiments of the present disclosure.

FIG. 2A is a schematic cross-sectional view of an example MSC including in a microelectronic assembly according to some embodiments of the present disclosure. The MSC 119 may include a first conductive layer 118-1, also referred to as a first plate or first electrode, having first microstructures 115-1 and a second conductive layer 118-2 on the first conductive layer 118-1 (e.g., in different metal layers of the substrate 112), the second conductive layer 118-2, also referred to as a second plate or second electrode, having second microstructures 115-2 that vertically interconnect with the first microstructures 115-1 of the first conductive layer 118-2. The conductive layers 118 may include any suitable conductive material, such as a metal, for example, copper. The microstructures 115 may have a thickness 191 (i.e., z-dimension, height, or z-height) between 2 microns and 20 microns (e.g., between 2 microns and 7 microns, between 7 microns and 12 microns, or between 12 microns and 18 microns). The microstructures 115 may have a width 193 (i.e., y-dimension) between 2 microns and 12 microns (e.g., between 2 microns and 7 microns or between 7 microns and 12 microns), such that the microstructures 115 may be spaced apart 195 between 2 microns and 12 microns. The first and second microstructures 115 may include any suitable shape, as described below with reference to FIGS. 2B-2E, and may be configured to increase a surface area of the high-k dielectric layer 117.

The MSC 119 may further include a high-k dielectric layer 117 between the first and second conductive layers 118-1, 118-2. The high-k dielectric layer 117 may have a thickness between 500 nanometers and 2 microns. In some embodiments, a material of the high-k dielectric layer 117 may include a material with a dielectric constant that is greater than 200 or may include a material that may be deposited using a Plasma Vapor deposition (PVD) process or a Chemical Vapor Deposition (CVD) process. For example, a high-k dielectric material 117 may include barium, titanium, and oxygen (e.g., in the form of Barium Titanium Oxide ($BaTiO_3$)); strontium, titanium, and oxygen (e.g., in the form of Strontium Titanate ($SrTiO_3$)); or lead, zirconium, and titanium (e.g., in the form of Lead Zirconate Titanate (PZT)).

Figure 2B:
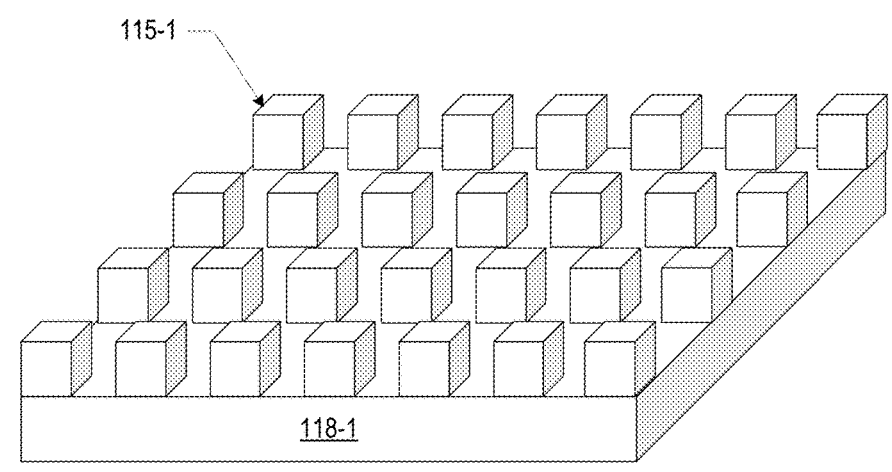
FIGS. 2B-2E are perspective views of portions of example capacitors according to some embodiments of the present disclosure.
Figure 2B:
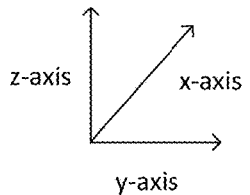
Figure 2C:
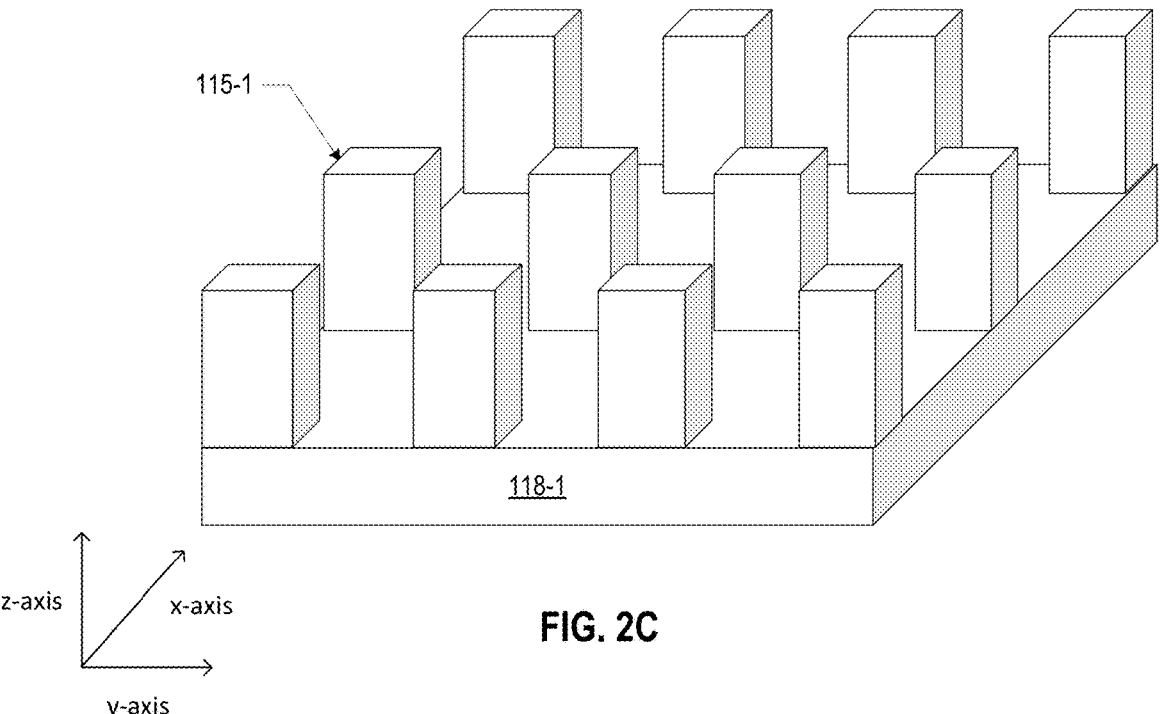
Figure 2D:
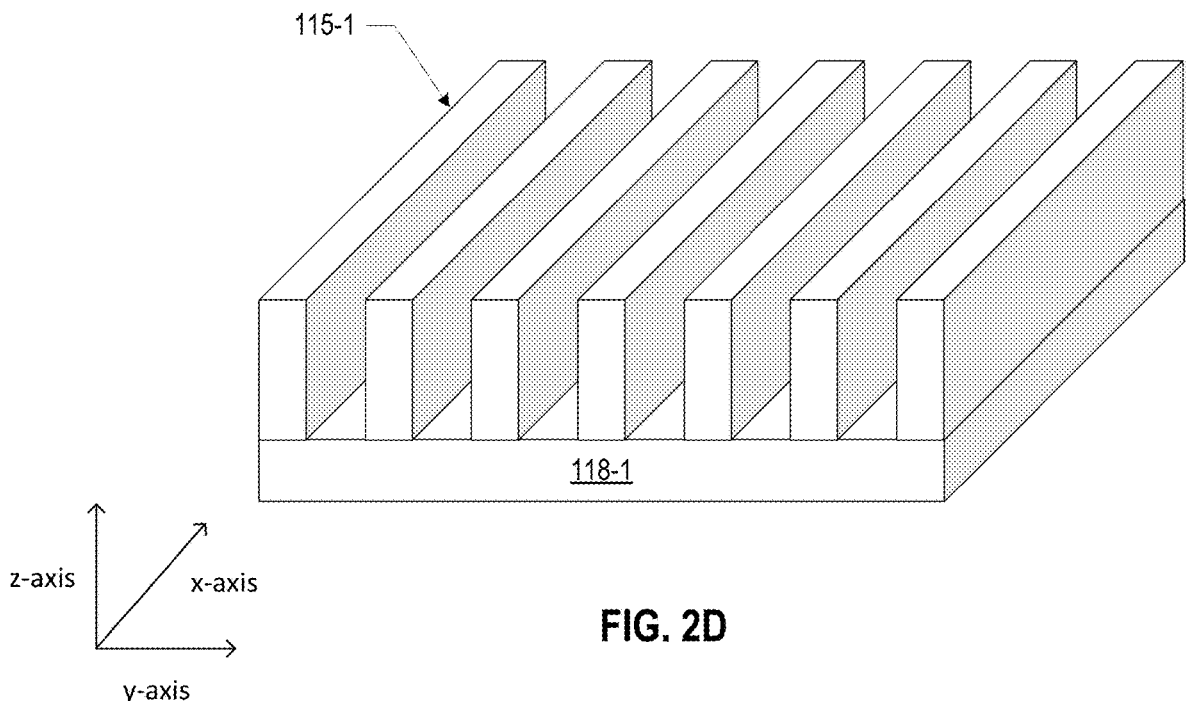
Figure 2E:
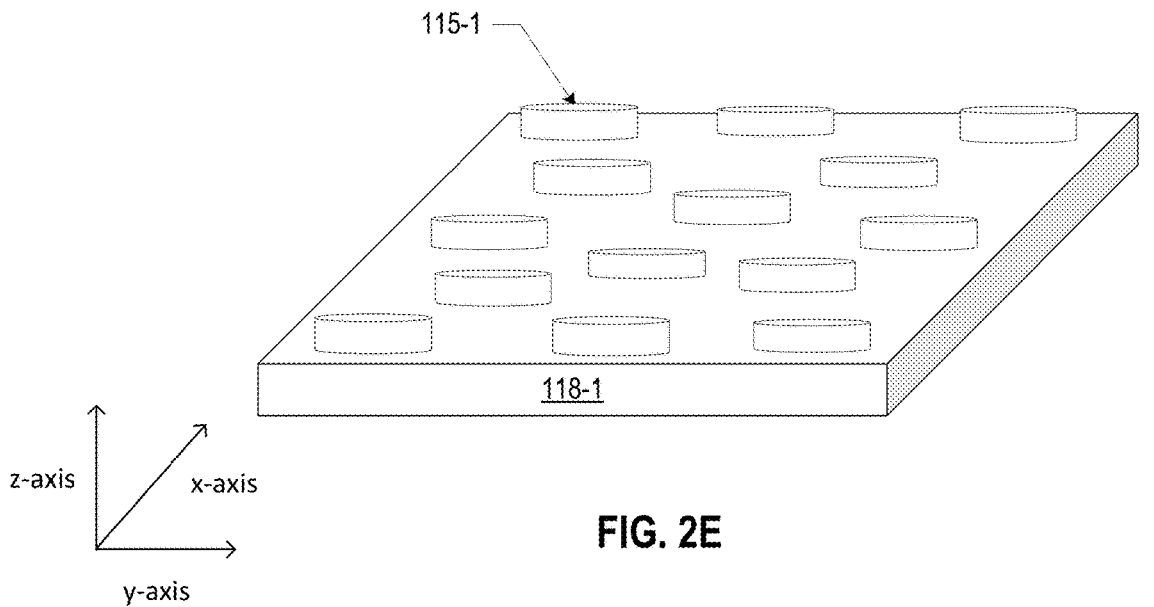

FIGS. 2B-2E are perspective views of portions of example capacitors according to some embodiments of the present disclosure. For example, the microstructures 115 may include pillars (e.g., as shown in FIGS. 2B and 2C), walls (e.g., as shown in FIG. 2D), or micro-protrusions or bumps (e.g., as shown in FIG. 2E), where a complementary structure may include a pore or a dimple. Although FIGS. 2B-2E illustrate only the first microstructures 115-1 of the first conductive layer 118-1, the second microstructures 115-2 of the second conductive layer 118-2 may be formed to complement and interlock with the first microstructures 115-1. Further, although FIGS. 2B-2E show microstructures 115 having particular cross-sections (e.g., square, rectangular, or circular), microstructures 115 may have any suitable cross-sections, including triangular, hexagonal, or oval, among others. The microstructures 115 may be configured to increase a surface area of the high-k dielectric layer 117. As shown in FIGS. 2B and 2C, the microstructures 115-1 may include pillars having a particular height (e.g., thickness), width, and spacing. For example, as shown in FIG. 2B, the microstructures 115-1 may have a height of 5 microns, a width of 5 microns, and may be spaced apart by 5 microns, such that a number of pillars in a surface area of 1 square millimeter ($mm^2$) is 10,000, a surface area of the high-k dielectric layer 117 (not shown) is 2 $mm^2$, and a capacitance per 1 $mm^2$ is increased by a factor of 200%. In another example (not shown), the microstructures 115-1 may have a height of 10 microns, a width of 5 microns, and may be spaced apart by 5 microns, such that a number of pillars in an area of 1 $mm^2$ is 10,000, a surface area of the high-k dielectric layer 117 (not shown) is 3 $mm^2$, and a capacitance per 1 $mm^2$ is increased by a factor of 300%. As shown in FIB. 2C, the microstructures 115-1 may have a height of 10 microns, a width of 10 microns, and may be spaced apart by 10 microns, such that a number of pillars in an area of 1 $mm^2$ is 2,500, a surface area of the high-k dielectric layer 117 (not shown) is 2 $mm^2$, and a capacitance per 1 $mm^2$ is increased by a factor of 200%. In yet another example (not shown), the microstructures 115-1 may have a height of 15 microns, a width of 10 microns, and may be spaced apart by 10 microns, such that a number of pillars in an area of 1 $mm^2$ is 2,500, a surface area of the high-k dielectric layer 117 (not shown) is 2.5 $mm^2$, and a capacitance per 1 $mm^2$ is increased by a factor of 250%.

Returning to FIG. 1, the substrate 112 may include a dielectric material 107 and a conductive material 108 (e.g., lines/traces/pads/contacts) with the conductive material 108 arranged in the dielectric material 107 to provide conductive pathways through the substrate 112 to route power, ground, and signals through the dielectric material 107 (e.g., including conductive traces and/or conductive vias, as shown). The dielectric material 107 of the substrate 112 may be formed in layers. In some embodiments, the dielectric material 107 may include an organic material, such as an organic buildup film. In some embodiments, the dielectric material 107 may include a ceramic, an epoxy film having filler particles therein, glass, an inorganic material, or combinations of organic and inorganic materials, for example. In some embodiments, the conductive material 108 may include a metal (e.g., copper). The conductive pathways 108 in the substrate 112 may be bordered by liner materials, such as adhesion liners and/or barrier liners, as suitable. Any method known in the art for fabrication of the substrate 112 may be used, including the methods discussed below with reference to FIG. 3.

Although a particular number and arrangement of layers of dielectric material 107/conductive material 108 are shown in various ones of the accompanying figures, these particular numbers and arrangements are simply illustrative, and any desired number and arrangement of dielectric material 107/ conductive material 108 may be used. Further, although a particular number of layers are shown in the substrate 112, these layers may represent only a portion of the substrate 112, for example, further layers may be present.

The microelectronic assembly 100 may further include die 114-1 and die 114-2 electrically coupled to a top surface 171-2 of the substrate 112 by interconnects 130. As used herein, the terms "die," "microelectronic component," and similar variations may be used interchangeably. In particular, conductive contacts 122 on a bottom surface of die 114-1, 114-2 may be electrically and mechanically coupled to conductive contacts 174 at a top surface of the substrate 112 by interconnects 130. Interconnects 130 may enable electrical coupling between die 114-1 and die 114-2 through conductive pathways 108 in substrate 112. Interconnects 130 disclosed herein may take any suitable form, including solder balls for a ball grid array arrangement, pins in a pin grid array arrangement or lands in a land grid array arrangement. In some embodiments, a set of interconnects 130 may include solder (e.g., solder bumps or balls that are subject to a thermal reflow to form the interconnects 130). Interconnects 130 that include solder may include any appropriate solder material, such as lead/tin, tin/bismuth, eutectic tin/ silver, ternary tin/silver/copper, eutectic tin/copper, tin/ nickel/copper, tin/bismuth/copper, tin/indium/copper, tin/ zinc/indium/bismuth, or other alloys. In some embodiments, a set of interconnects 130 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression. In some embodiments, interconnects 130 disclosed herein may have a pitch between about 18 microns and 75 microns. As used herein, pitch is measured center-to-center (e.g., from a center of a conductive contact to a center of an adjacent conductive contact).

The die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imagable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). The conductive pathways in the dies 114 may be bordered by liner materials, such as adhesion liners and/or barrier liners, as suitable. In some embodiments, the die 114 is a wafer. In some embodiments, the die 114 is a monolithic silicon, a fan-out or fan-in package die, or a die stack (e.g., wafer stacked, die stacked, or multi-layer die stacked). In various embodiments, die 114 may include, or be a part of, one or more of a central processing unit (CPU), a memory device (e.g., a high-bandwidth memory device), a logic circuit, input/output circuitry, a transceiver such as a field programmable gate array transceiver, a gate array logic such as a field programmable gate array logic, of a power delivery circuitry, a III-V or a III-N device such as a III-N or III-N amplifier (e.g., GaN amplifier), Peripheral Component Interconnect Express (PCIe) circuitry, Double Data Rate (DDR) transfer circuitry, or other electronic components known in the art. In some embodiments, die 114-1 and die 114-2 may comprise different functionalities. As used herein, the term "functionality" with reference to a die refers to one or more functions (e.g., capability, task, operation, action, instruction execution, etc.) that the die in question can perform. For example, die 114-1 may be a CPU and die 114-2 may be a Graphics Processing Unit (GPU) or memory. In other embodiments, die 114-1 and die 114-2 may comprise the same or similar functionalities. For example, IC die 114-1 and die 114-2 may each comprise memory. Example structures that may be included in the dies 114 disclosed herein are discussed below with reference to FIG. 4.

The microelectronic assembly 100 of FIG. 1 may also include an insulating material 133 that encapsulates the die 114 (e.g., on and around die 114 and interconnects 130). The insulating material 133 may extend from a top surface 171-2 of the substrate 112 to a top surface of the die 114. In some embodiments, the insulating material 133 may be a mold material, such as an organic polymer with inorganic silicon oxide or aluminum oxide particles, a resin material, or an epoxy material. In some embodiments (not shown) other components, such as heat sinks may be coupled to microelectronic assembly 100 based on particular needs.

The microelectronic assembly 100 of FIG. 1 may also include an underfill material 127. In some embodiments, the underfill material 127 may extend between die 114-1, 114-2 and the top surface 171-2 of the substrate 112 around the associated interconnects 130. The underfill material 127 may be an insulating material, such as an appropriate epoxy material. In some embodiments, the underfill material 127 may include a capillary underfill, non-conductive film (NCF), or molded underfill. In some embodiments, the underfill material 127 may include an epoxy flux that assists with soldering die 114-1, 114-2 to the substrate 112 when forming the interconnects 130, and then polymerizes and encapsulates the interconnects 130. The underfill process may include dispensing underfill material in liquid form, allowing the material to flow and fill the interstitial gaps around interconnects 130, and subjecting the assembly to a curing process, such as baking, to solidify the material. In some embodiments, an underfill material 127 may be omitted. Although FIG. 1 shows two separate underfill 127 portions under die 114-1 and die 114-2, the underfill 127 may be a single underfill 127 under die 114-1 and die 114-2. The underfill material 127 may be selected to have a coefficient of thermal expansion (CTE) that may mitigate or minimize the stress between die 114 and the substrate 112 arising from uneven thermal expansion in the microelectronic assembly 100. In some embodiments, the CTE of the underfill material 127 may have a value that is intermediate to a CTE of the dielectric material 107 of the substrate 112 and a CTE of the insulating material of die 114.

The microelectronic assembly 100 of FIG. 1 may also include a circuit board 131. In particular, conductive contacts 172 on a bottom surface of the substrate 112 may be electrically coupled to conductive contacts 146 on a top surface of circuit board 131 by interconnects 150. Interconnects 150 disclosed herein may take any suitable form, including any of the forms described above with reference to interconnects 130. As shown in FIG. 1, in some embodiments, a set of interconnects 150 may include solder (e.g., solder bumps or balls that are subject to a thermal reflow to form the interconnects 150). In some embodiments, the interconnects 150 disclosed herein may have a pitch between about 50 microns and 300 microns. In some embodiments, an underfill material 127 may extend between the first surface 171-1 of the substrate 112 and the circuit board 131 around the associated interconnects 150. The circuit board 131 may be a motherboard, for example, and may have other components attached to it. The circuit board may include conductive pathways and other conductive contacts for routing power, ground, and signals through the circuit board, as known in the art. In some embodiments, the interconnects 150 may not couple to a circuit board 131, but may instead couple to another IC package, an interposer, or any other suitable component.

In some embodiments, one or more levels of solder resist 126 (e.g., epoxy liquid, liquid photoimageable polymers, dry film photoimageable polymers, acrylics, solvents) may be provided in an IC package described herein. Solder resist may be a liquid or dry film material including photoimageable polymers. In some embodiments, solder resist may be non-photoimageable.

Although the microelectronic assembly 100 of FIG. 1 shows a substrate 112 having a particular number and arrangement of MSCs 119, a microelectronic assembly 100 may have any suitable number and arrangement of MSCs 119 in a substrate 112, including between 2 and 50 (e.g., between 2 MSCs and 20 MSCs, or between 20 MSCs and 50 MSCs).

Any suitable techniques may be used to manufacture the microelectronic assemblies 100 disclosed herein. For example, FIGS. 3A-3L are side, cross-sectional views of various stages in an example process for manufacturing the microelectronic assembly 100 of FIG. 1, in accordance with various embodiments. Although the operations discussed below with reference to FIGS. 3A-3L (and others of the accompanying drawings representing manufacturing processes) are illustrated in a particular order, these operations may be performed in any suitable order. Further, additional operations which are not illustrated may also be performed without departing from the scope of the present disclosure. Also, various ones of the operations discussed herein with respect to FIGS. 3A-3L may be modified in accordance with the present disclosure to fabricate others of microelectronic assembly 100 disclosed herein. Although FIGS. 3A-3L illustrate simultaneously forming assemblies on top and bottom surfaces of a carrier, assemblies may be formed on a single surface rather than on both surfaces.

Figures 3A, 3B:
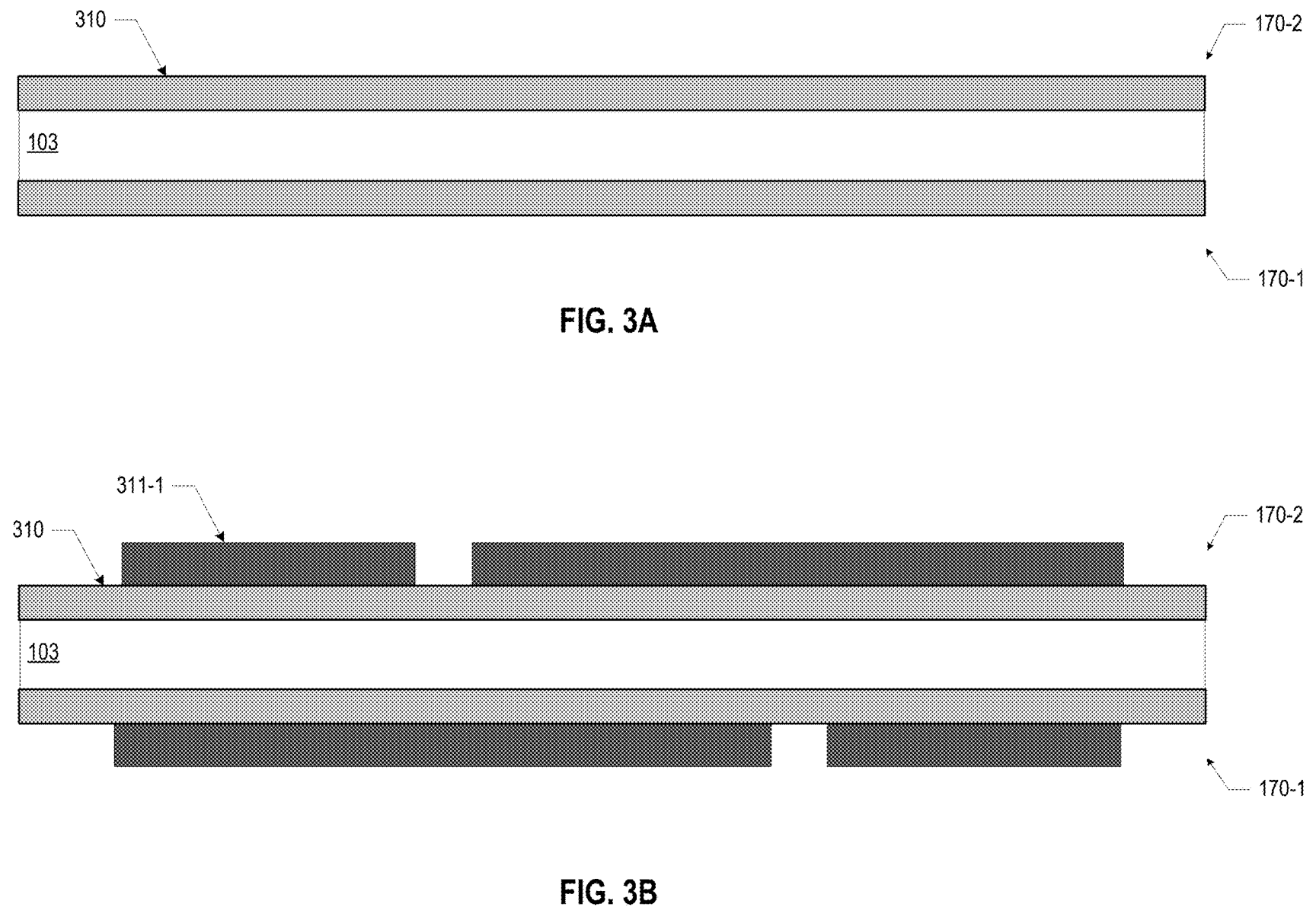

FIG. 3A illustrates a glass carrier 103 including a conductive material 310 on a first surface 170-1 and a second surface 170-2. A conductive material 310 may include a metal, such as copper. The conductive material 310 may be deposited on the glass carrier 103 using any suitable technique, such as plating.

FIG. 3B illustrates an assembly subsequent to applying and lithographically patterning a first photoresist 311-1 to the conductive material 310 on the first and second surfaces 170-1, 170-2 of the glass carrier 103. The first photoresist 311-1 may be a liquid or dry film type.

Figures 3C, 3D:
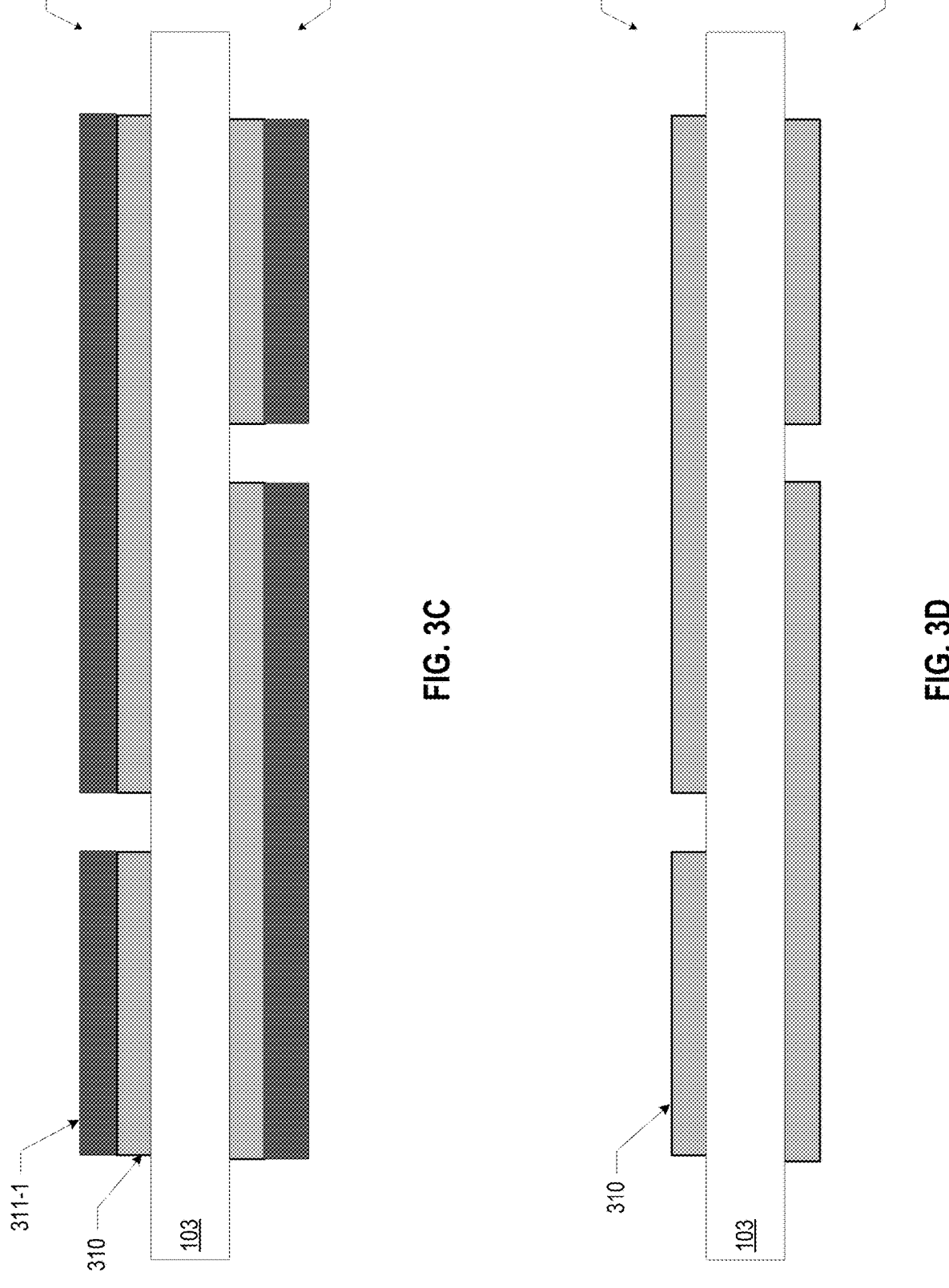

FIG. 3C illustrates an assembly subsequent to removing the exposed portions of the conductive material 310. The conductive material 310 may be removed using any suitable process such as etching.

FIG. 3D illustrates an assembly subsequent to removing the first photoresist 311-1 from the assembly of FIG. 3C.

Figures 3E, 3F:
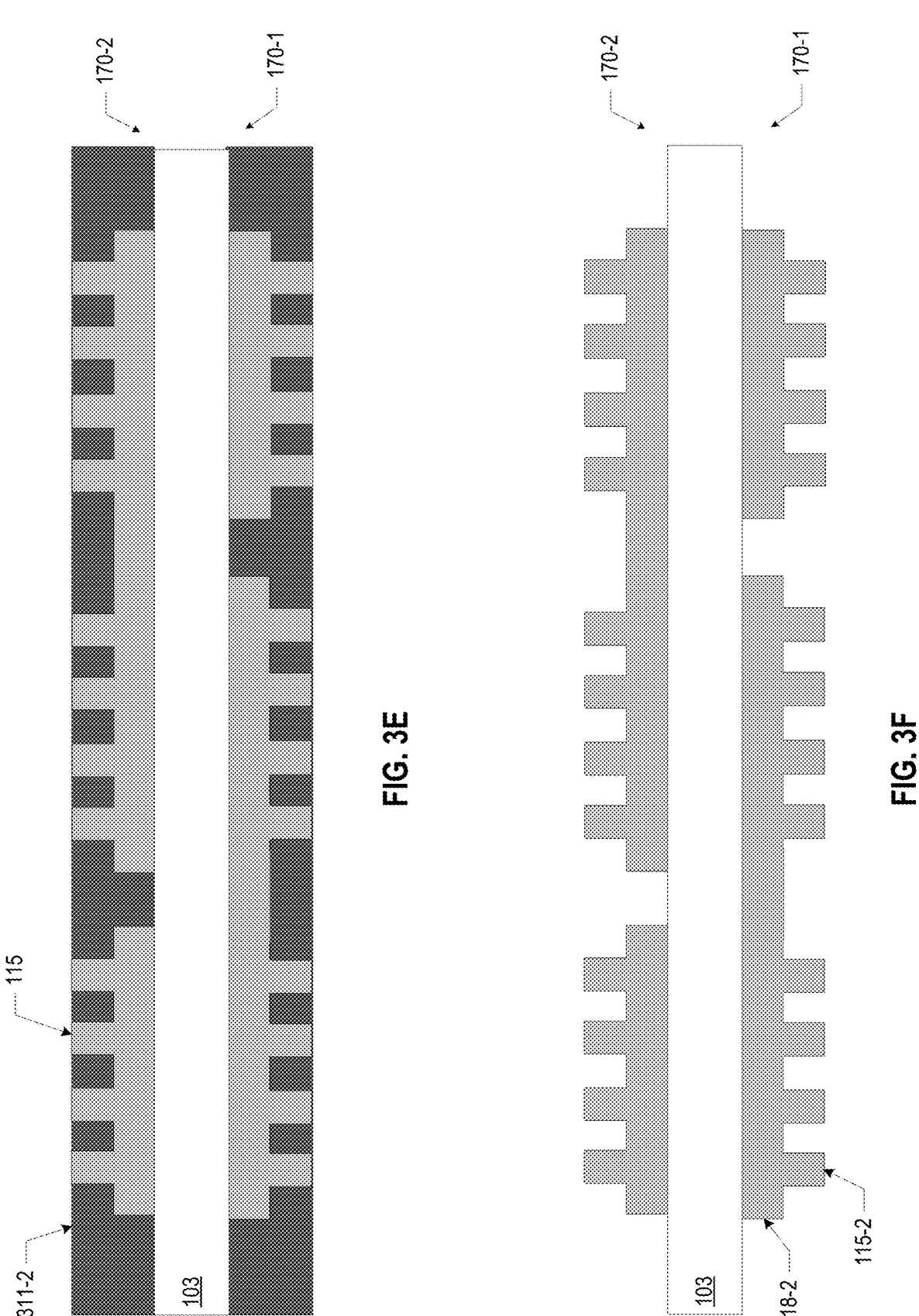

FIG. 3E illustrates an assembly subsequent to applying and lithographically patterning a second photoresist 311-2 and depositing a conductive material in the openings of the patterned second photoresist 311-2 to form microstructures 115. The second photoresist 311-2 may be a liquid or dry film type. The conductive material may be deposited to form the microstructures 115 using any suitable technique, such as electrolytic plating. In some embodiments, excess conductive material may be etched or polished off the surface of the microstructures 115 using, for example, chemical/mechanical planarization (CMP) process.

FIG. 3F illustrates an assembly subsequent to removing the second photoresist 311-2 from the assembly of FIG. 3E. As shown in FIG. 3F, the processes described in FIGS. 3A-3F form a second conductive layer 118-2 having second microstructures 115-2 of an MSC 119 (e.g., MSC 119 in FIG. 1).

Figures 3G, 3H:
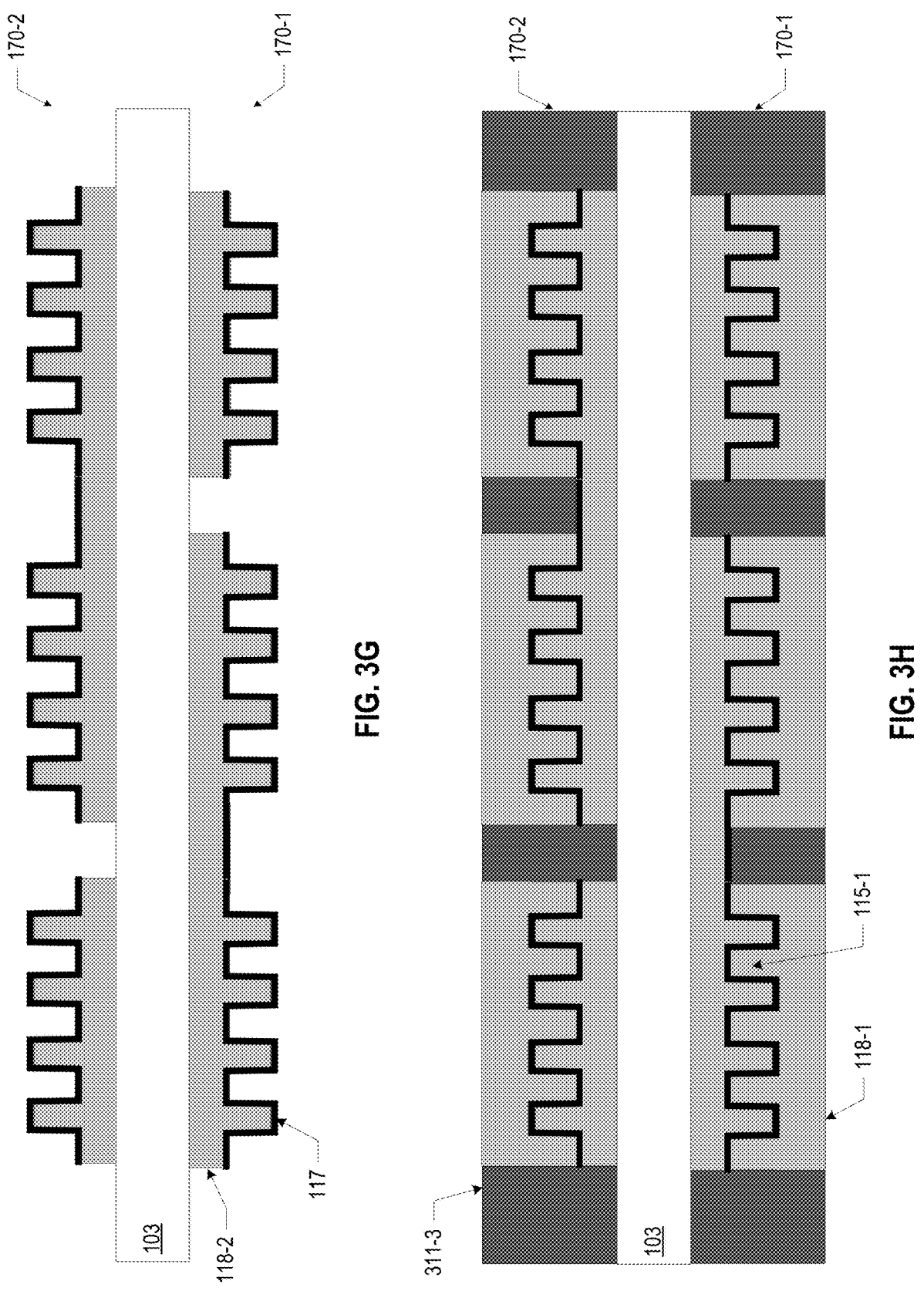

FIG. 3G illustrates an assembly subsequent to depositing a high-k dielectric layer 117 on the second conductive layer 118-2. The high-k dielectric layer may be deposited using any suitable technique, such as sputtering, PVD, or CVD. The high-k dielectric layer 117 may be sintered subsequent to sputtering to stabilize the crystalline structure of the high-k dielectric material 117. The glass carrier 103 may withstand exposure to high annealing temperatures required for a high-k dielectric material 117. For example, a sintering temperature for Barium Titanium Oxide is approximately 900° C. and a softening temperature (e.g., melting transition temperature) for glass is between 700° C. and 1500° C. Further, a higher sintering temperature may lead to a higher dielectric constant value resulting in a higher capacitance density and improved frequency stability beyond 100 Mega-Hertz (MHz), which enables an on-package voltage regulator with a higher switching frequency.

FIG. 3H illustrates an assembly subsequent to applying and lithographically patterning a third photoresist 311-3 and depositing a conductive material in the openings of the patterned third photoresist 311-3 to form a first conductive layer 118-1 having first microstructures 115-1. The third photoresist 311-3 may be a liquid or dry film type. The conductive material may be deposited using any suitable technique.

Figure 3I:
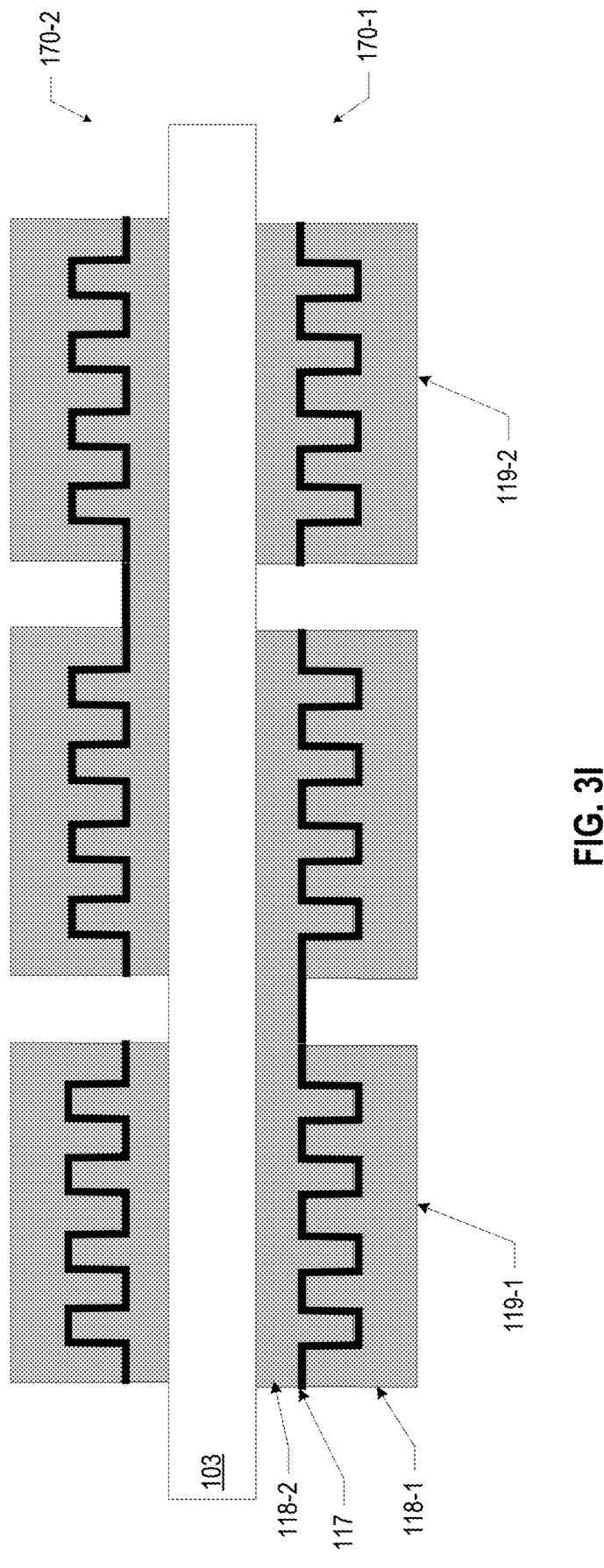

FIG. 3I illustrates an assembly subsequent to removing the third photoresist 311-3 from the assembly of FIG. 3H. As shown in FIG. 3H, the processes described in FIGS. 3A-3H form an MSC 119, including MSC 119-1 and MSC 119-2. MSC 119-1 may be formed with a single, continuous second conductive layer 118-2 having second microstructures 115-2 and two or more first conductive layers 118-1 having first microstructures 115-1 that interlock with the second microstructures 115-2 of the second conductive layer 118-2. MSC 119-2 may be formed with a single second conductive layer 118-2 having second microstructures 115-2 and a single first conductive layers 118-1 having first microstructures 115-1 that interlock with the second microstructures 115-2 of the second conductive layer 118-2. Although the MSCs 119 illustrated in FIG. 3I include a particular number and arrangement of first conductive layers 118-1 interconnected with the second conductive layer 118-2 (e.g., one second conductive layer 118-2 and one (e.g., MSC 119-2) or two (e.g., MSC 119-2) first conductive layers 118-1), an MSC 119 may have any suitable number and arrangement of first and second conductive layers 118-1, 118-2, including three or more first conductive layers 118-1 interconnected with the second conductive layer 118-2.

Figure 3J:
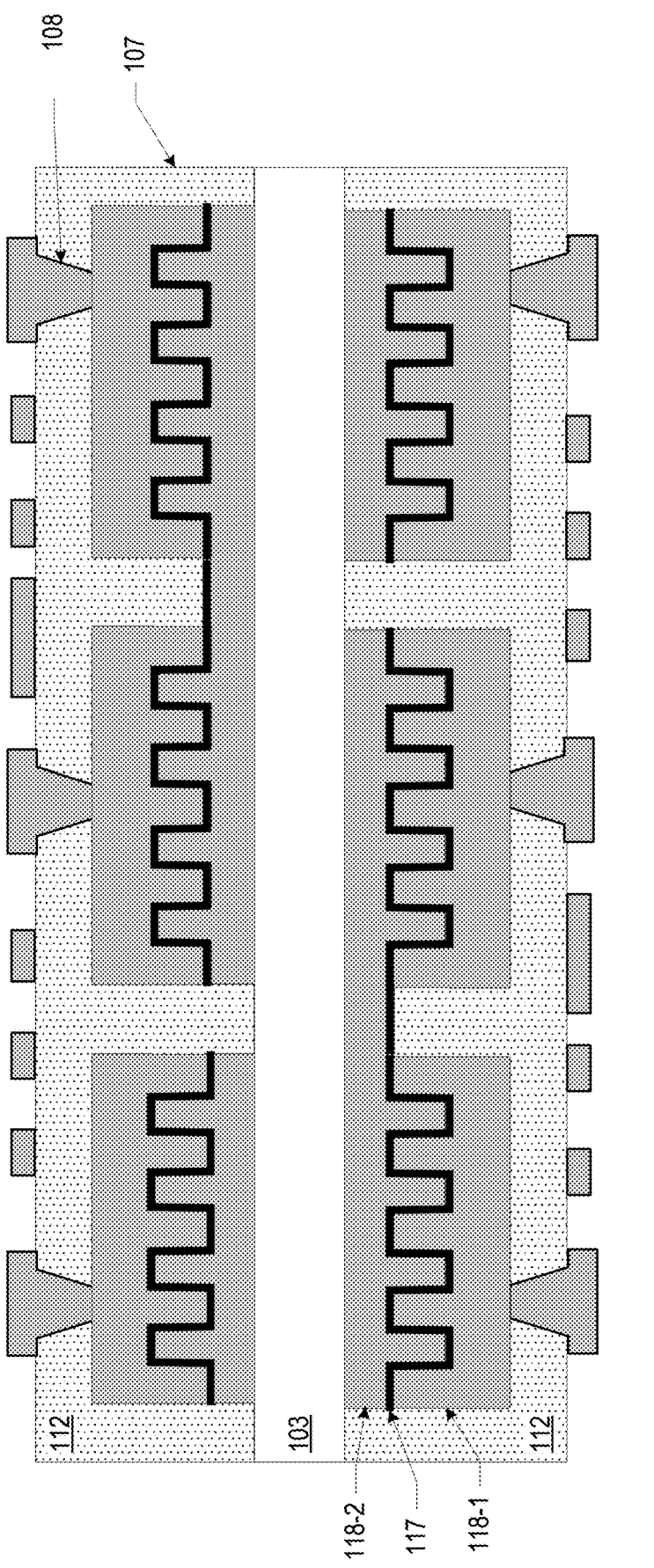

FIG. 3J illustrates an assembly subsequent to forming a portion of a substrate 112 including a dielectric material 107 and conductive pathways 108 on the assembly of FIG. 3I. A portion of the substrate 112 may be formed using any suitable technique, such as a lamination process, a semi-additive process, or other buildup process. Conductive pathways 108 may be electrically coupled to the first and second conductive layers 118-1, 118-2 to create terminal connections forming first and second electrodes, respectively, of the MSC 119.

Figure 3K:
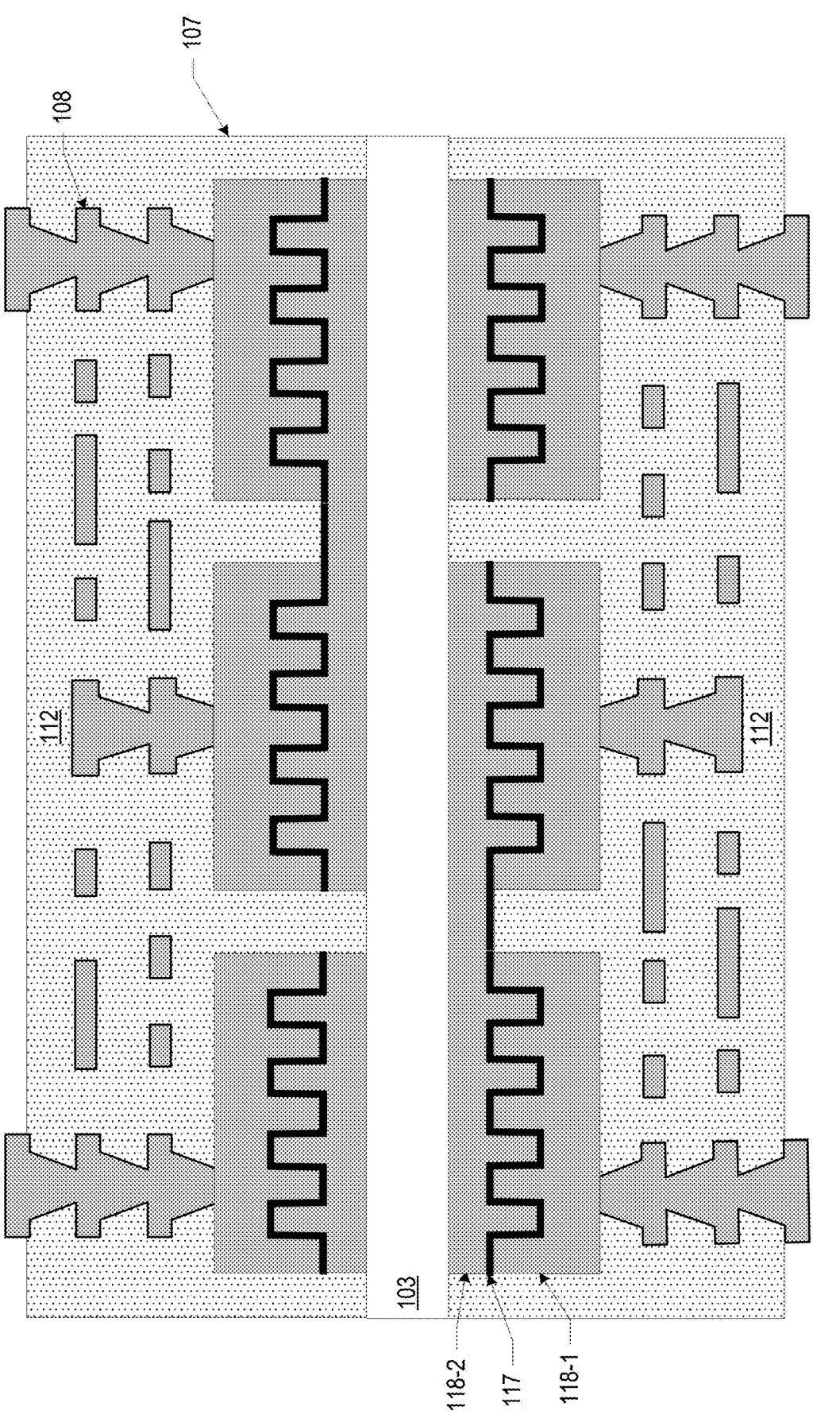

FIG. 3K illustrates an assembly subsequent to completing the substrate 112 by forming additional layers of dielectric material 107 and conductive material 108.

Figure 3L:
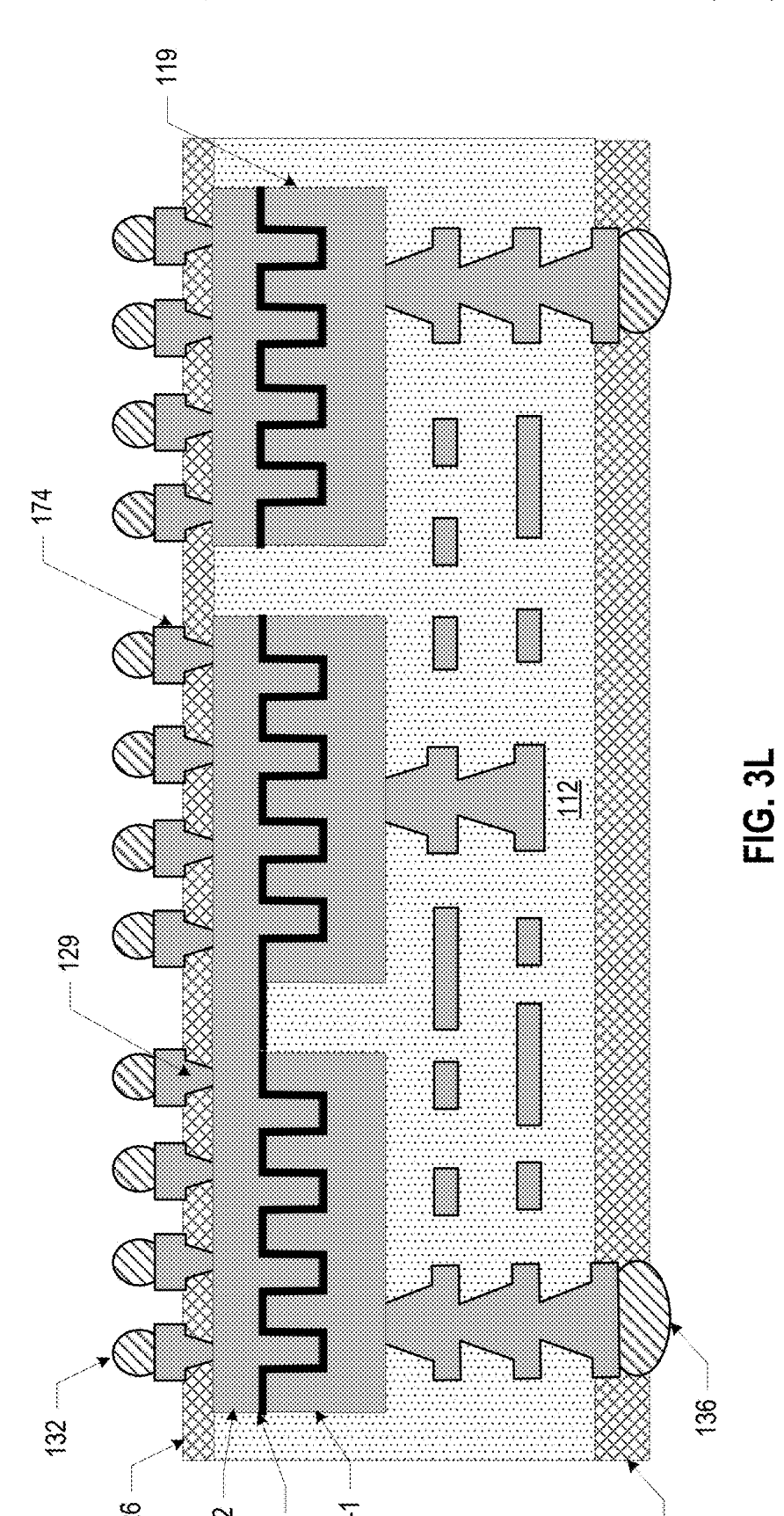

FIG. 3L illustrates an assembly subsequent to removing the glass carrier 103, forming via connections 129 to the MSC 119, forming conductive contacts 174, and performing finishing operations. Via connections 129 and conductive contacts 174 may be formed using any suitable techniques, including lamination and lithography (e.g., of solder resist 126). If multiple assemblies are manufactured together, multiple assemblies may be singulated. Example finishing operations include depositing solder resist, if not deposited previously, and depositing solder 132 on conductive contacts 174 and solder 136 on conductive contacts 172.

The assembly of FIG. 3L may itself be a microelectronic assembly 100, as shown. Further manufacturing operations may be performed on the microelectronic assembly 100 of FIG. 3L to form other microelectronic assembly 100. For example, the solder 132 of microelectronic assembly 100 of FIG. 3L may be electrically coupled to dies 114-1, 114-2 to form interconnects 130, and/or the solder 136 may be electrically coupled to a circuit board 131 to form interconnects 150, similar to the microelectronic assembly 100 of FIG. 1. Any suitable method may be used to place die 114, for example, automated pick-and-place. The assembly may be subjected to a solder reflow process during which solder (e.g., solder 132, 136) of the interconnects 130, 150 melt and bond to mechanically and electrically couple dies 114 to the substrate 112. In some embodiments, an insulating material 133 may be deposited to completely cover the dies 114 and the overburden of insulating material 133 may be removed to expose a top surface of the dies 114. The insulating material 133 may be removed using any suitable technique, including etching, mechanical milling, or laser ablation. In some embodiments, an underfill material (e.g., underfill material 127 of FIG. 1) may be deposited around interconnects 130 prior to overmolding with the insulating material 133 and around interconnects 150.

Figure 4:
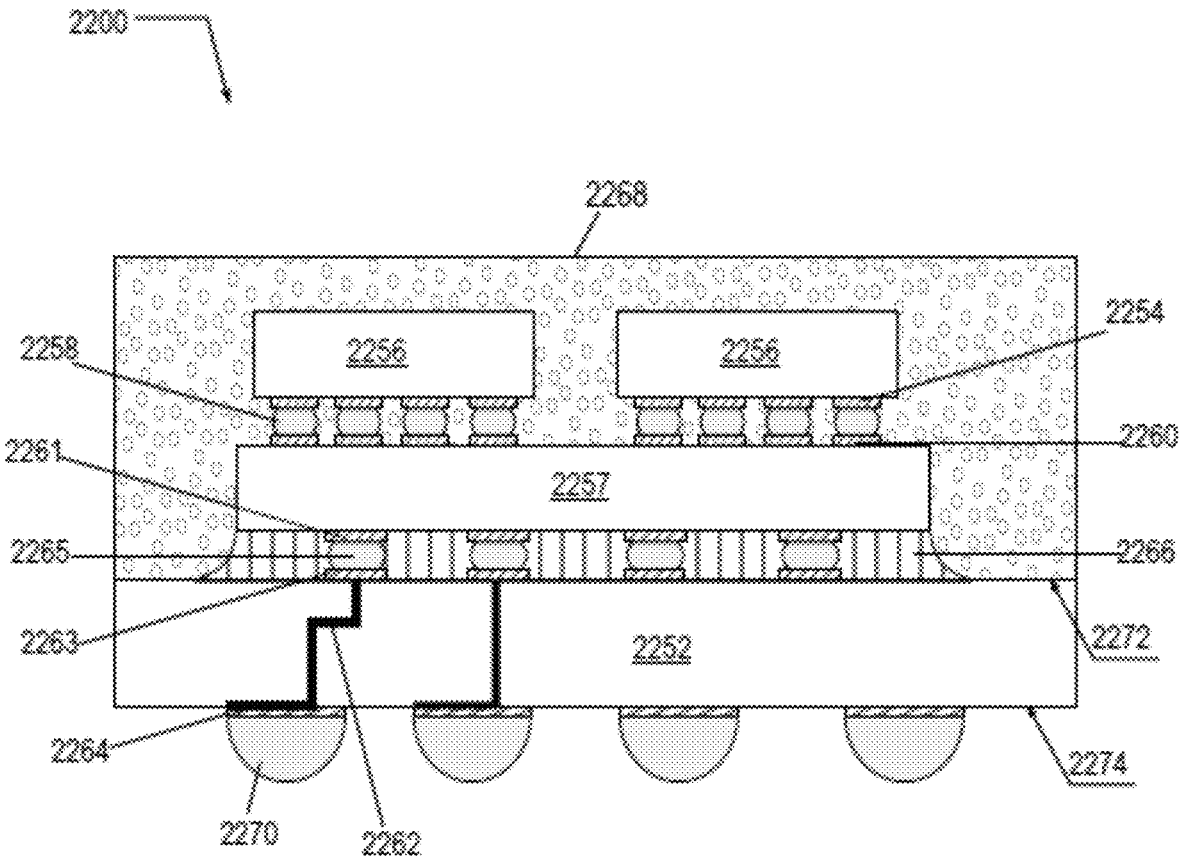
FIG. 4 is a cross-sectional view of a device package that may include one or more microelectronic assemblies in accordance with any of the embodiments disclosed herein.
Figure 5:
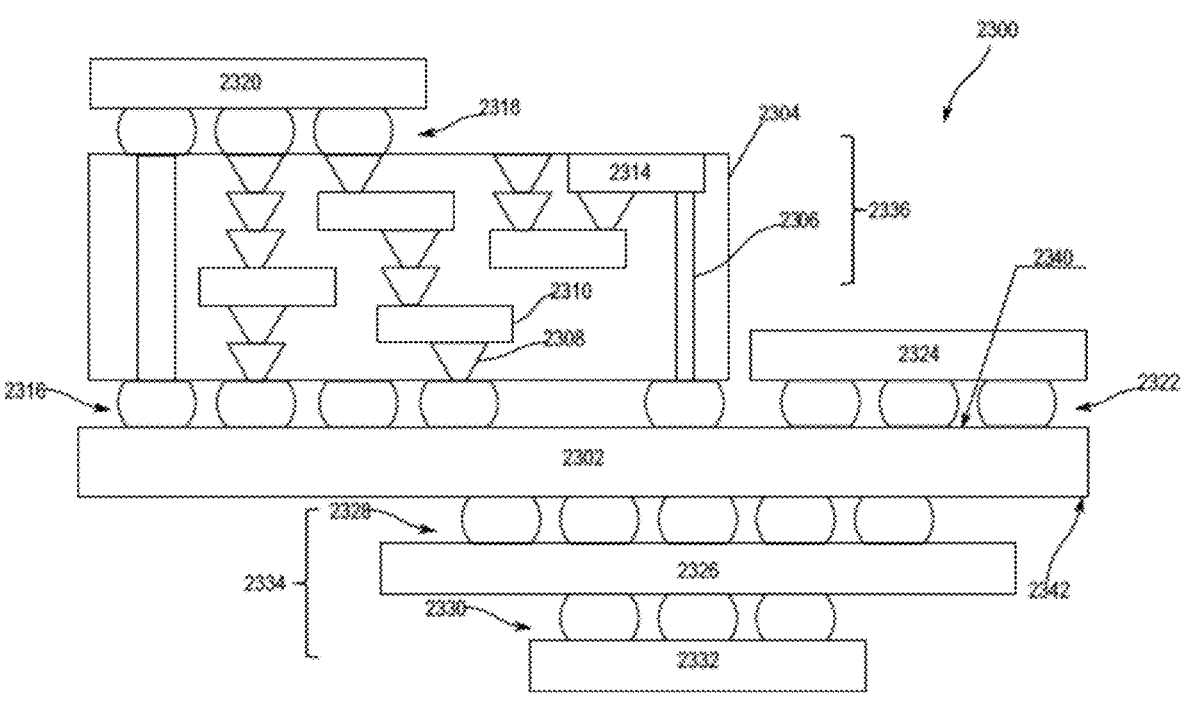
FIG. 5 is a cross-sectional side view of a device assembly that may include one or more microelectronic assemblies in accordance with any of the embodiments disclosed herein.
Figure 6:
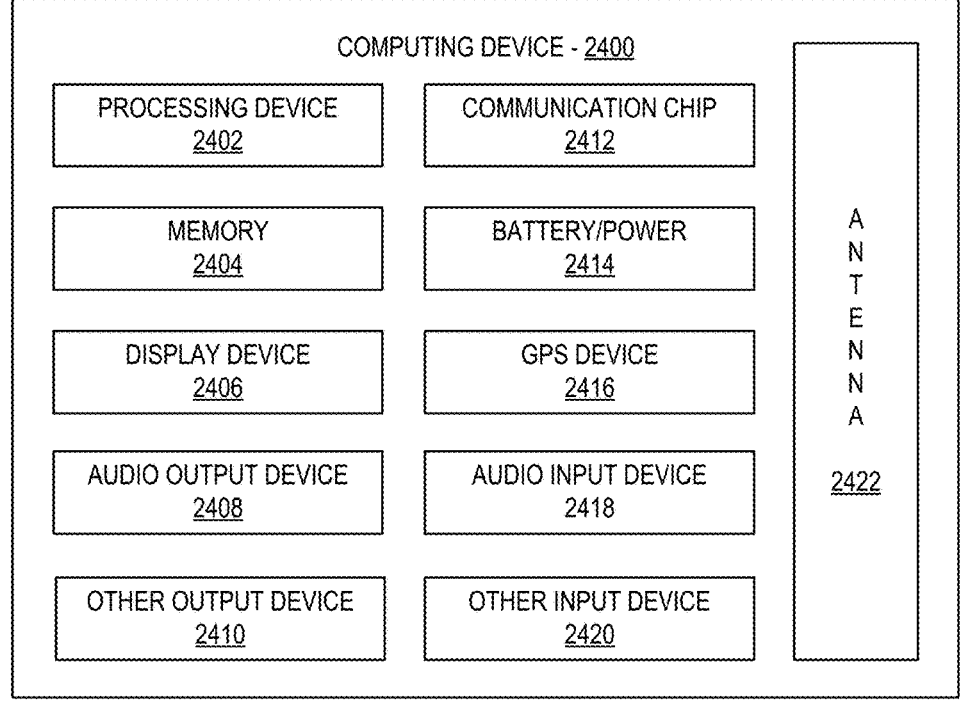
FIG. 6 is a block diagram of an example computing device that may include one or more microelectronic assemblies in accordance with any of the embodiments disclosed herein.

The packages disclosed herein, e.g., any of the microelectronic assemblies 100, or any further embodiments described herein, may be included in any suitable electronic component. FIGS. 4-6 illustrate various examples of packages, assemblies, and devices that may be used with or include any of the IC packages as disclosed herein.

FIG. 4 is a side, cross-sectional view of an example IC package 2200 that may include microelectronic assemblies in accordance with any of the embodiments disclosed herein. In some embodiments, the IC package 2200 may be a system-in-package (SiP).

As shown in FIG. 4, package support 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias, e.g., as discussed above with reference to FIG. 1.

Package support 2252 may include conductive contacts 2263 that are coupled to conductive pathway 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, FLI 2265, and conductive contacts 2263 of package support 2252. FLI 2265 illustrated in FIG. 4 are solder bumps, but any suitable FLI 2265 may be used, such as solder bumps, solder posts, or bond wires.

IC package 2200 may include one or more dies 2256 coupled to interposer 2257 via conductive contacts 2254 of dies 2256, FLI 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). FLI 2258 illustrated in FIG. 4 are solder bumps, but any suitable FLI 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around FLI 2265, and mold 2268 may be disposed around dies 2256 and interposer 2257 and in contact with package support 2252. In some embodiments, underfill material 2266 may be the same as mold 2268. Example materials that may be used for underfill material 2266 and mold 2268 are epoxies as suitable. SLI 2270 may be coupled to conductive contacts 2264. SLI 2270 illustrated in FIG. 4 are solder balls (e.g., for a ball grid array (BGA) arrangement), but any suitable SLI 2270 may be used (e.g., pins in a pin grid array arrangement or lands in a land grid array arrangement). SLI 2270 may be used to couple IC package 2200 to another component, such as a circuit board (e.g., a motherboard), an interposer, or another IC package, as known in the art and as discussed below with reference to FIG. 6.

In embodiments in which IC package 2200 includes multiple dies 2256, IC package 2200 may be referred to as a multichip package (MCP). Dies 2256 may include circuitry to perform any desired functionality. For example, besides one or more of dies 2256 comprising components of dies 114 as described herein, one or more of dies 2256 may be logic dies (e.g., silicon-based dies), one or more of dies 2256 may be memory dies (e.g., high-bandwidth memory), etc. In some embodiments, at least some of dies 2256 may not include components of dies 114 as described herein.

Although IC package 2200 illustrated in FIG. 4 is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

FIG. 5 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more micro-electronic assembly 100 in accordance with any of the embodiments disclosed herein; e.g., any of the IC packages discussed below with reference to IC device assembly 2300 may take the form of any of the embodiments of IC package 2200 discussed above with reference to FIG. 4.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 5 illustrates that, in some embodiments, IC device assembly 2300 may include a package-on-interposer struc-ture 2336 coupled to first face 2340 of circuit board 2302 by coupling components 2316. In other embodiments, package-on-interposer structure 2336 may not comprise any glass core. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling com-ponents 2318. In some embodiments, IC package 2320 may comprise microelectronic assembly 100 and other compo-nents as described herein, which are not shown so as not to clutter the drawing. Coupling components 2318 may take any suitable form depending on desired functionalities, such as the forms discussed above with reference to coupling components 2316. In some embodiments, IC package 2320 may be or include IC package 2200, e.g., as described above with reference to FIG. 4.

Although a single IC package 2320 is shown in FIG. 5, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connec-tion to a wider pitch or reroute a connection to a different connection. For example, interposer 2304 may couple IC package 2320 to a BGA of coupling components 2316 for coupling to circuit board 2302.

In the embodiment illustrated in FIG. 5, IC package 2320 and circuit board 2302 are attached to opposing sides of interposer 2304. In other embodiments, IC package 2320 and circuit board 2302 may be attached to a same side of interposer 2304. In some embodiments, three or more com-ponents may be interconnected by way of interposer 2304.

Interposer 2304 may be formed of an epoxy resin, a fiberglass reinforced epoxy resin, a ceramic material, or a polymer material such as polyimide. In some implementa-tions, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including TSVs 2306. Interposer 2304 may further include embedded devices 2314, including both passive and active devices. Such devices may include, but are not limited to, capacitors, decoupling capacitors, resis-tors, inductors, fuses, diodes, transformers, sensors, electro-static discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodi-ments discussed above with reference to coupling compo-nents 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling com-ponents 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 6 is a block diagram of an example computing device 2400 that may include one or more components having one or more IC packages in accordance with any of the embodiments disclosed herein. For example, any suit-able ones of the components of computing device 2400 may include microelectronic assembly 100 including an MSC 119 in accordance with any of the embodiments disclosed herein. In another example, any one or more of the compo-nents of computing device 2400 may include any embodi-ments of IC package 2200 (e.g., as shown in FIG. 4). In yet another example, any one or more of the components of computing device 2400 may include an IC device assembly 2300 (e.g., as shown in FIG. 5).

A number of components are illustrated in FIG. 6 as included in computing device 2400, but any one or more of these components may be omitted or duplicated, as suitable for the application. In some embodiments, some or all of the components included in computing device 2400 may be attached to one or more motherboards. In some embodi-ments, some or all of these components are fabricated onto a single SOC die.

Additionally, in various embodiments, computing device 2400 may not include one or more of the components illustrated in FIG. 6, but computing device 2400 may include interface circuitry for coupling to the one or more components. For example, computing device 2400 may not include a display device 2406, but may include display device interface circuitry (e.g., a connector and driver cir-cuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips; note that the terms "chip," "die," and "IC die" are used interchangeably herein). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives of it, as well as any other wireless protocols that are designated as 3G, 4G, 5G, and beyond. Communication chip 2412 may operate in accordance with other wireless protocols in other embodiments. Computing device 2400 may include an antenna

2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The following paragraphs provide various examples of the embodiments disclosed herein.

Example 1 is a microelectronic substrate, including a first conductive layer having first microstructures at a first surface; a second conductive layer on the first conductive layer, the second conductive layer having second microstructures at a second surface, wherein the second microstructures vertically interlock with the first microstructures; and a high-k dielectric material between the first microstructures and the second microstructures.

Example 2 may include the subject matter of Example 1, and may further specify that the first microstructures and the second microstructures include pillars or walls.

Example 3 may include the subject matter of Example 2, and may further specify that a thickness of the first microstructures is between 2 microns and 20 microns.

Example 4 may include the subject matter of Example 2, and may further specify that the first microstructures include pillars, and one (1) square millimeter (mm²) surface area of the first conductive layer includes between 2,500 pillars and 10,000 pillars.

Example 5 may include the subject matter of any of Examples 1-4, and may further specify that a thickness of the high-k dielectric material is between 500 nanometers and 2 microns.

Example 6 may include the subject matter of any of Examples 1-5, and may further specify that the high-k dielectric material includes barium, titanium, and oxygen; strontium, titanium, and oxygen; or lead, zirconium, and titanium.

Example 7 may include the subject matter of Example 2, and may further specify that the first microstructures include pillars, a thickness of the first microstructures is between 5 microns and 15 microns, and a spacing between the first microstructures is between 5 microns and 10 microns.

Example 8 is a microelectronic assembly, including a substrate having a first surface and an opposing second surface; a capacitor in the substrate adjacent to the second surface, the capacitor including a first conductive layer having first microstructures at a surface; a second conductive layer on the first conductive layer, the second conductive layer having second microstructures at a surface, wherein the second microstructures vertically interlock with the first microstructures; and a high-k dielectric material between the first microstructures and the second microstructures; and a die at the second surface of the substrate and electrically coupled to the capacitor.

Example 9 may include the subject matter of Example 8, and may further specify that the first microstructures and the second microstructures include pillars or walls.

Example 10 may include the subject matter of Examples 8 or 9, and may further specify that a thickness of the first microstructures is between 2 microns and 20 microns.

Example 11 may include the subject matter of Example 8, and may further specify that the first microstructures include pillars, and one (1) square millimeter (mm²) surface area of the first conductive layer includes between 2,500 pillars and 10,000 pillars.

Example 12 may include the subject matter of any of Examples 8-11, and may further specify that a thickness of the high-k dielectric material is between 500 nanometers and 2 microns.

Example 13 may include the subject matter of any of Examples 8-12, and may further specify that the high-k dielectric material includes barium, titanium, and oxygen; strontium, titanium, and oxygen; or lead, zirconium, and titanium.

Example 14 may include the subject matter of any of Examples 8-13, and may further include a circuit board electrically coupled to the first surface of the substrate.

Example 15 is a microelectronic assembly, including a substrate having a first surface and an opposing second surface; a plurality of capacitors in the substrate adjacent to the second surface, the plurality of capacitors including a first conductive layer having first microstructures at a surface; a second conductive layer on the first conductive layer, the second conductive layer having second microstructures at a surface, wherein the second microstructures vertically interlock with the first microstructures; and a high-k dielectric material between the first microstructures and the second microstructures; and a first die at the second surface of the substrate and electrically coupled to one of the plurality of capacitors; and a second die at the second surface of the substrate and electrically coupled to another one of the plurality of capacitors.

Example 16 may include the subject matter of Example 15, and may further specify that the first microstructures and the second microstructures include pillars or walls.

Example 17 may include the subject matter of Examples 15 or 16, and may further specify that a thickness of the first microstructures is between 2 microns and 20 microns.

Example 18 may include the subject matter of any of Examples 15-17, and may further specify that a thickness of the high-k dielectric material is between 500 nanometers and 2 microns.

Example 19 may include the subject matter of any of Examples 15-18, and may further specify that the high-k dielectric material includes barium, titanium, and oxygen; strontium, titanium, and oxygen; or lead, zirconium, and titanium.

Example 20 may include the subject matter of any of Examples 15-19, and may further specify that the plurality of capacitors includes between 20 capacitors and 50 capacitors.

The invention claimed is:

1. A microelectronic substrate, comprising:
a first conductive layer having first microstructures at a first surface;
a second conductive layer on the first conductive layer, the second conductive layer having second microstructures at a second surface, wherein the second microstructures vertically interlock with the first microstructures; and
a high-k dielectric material between the first microstructures and the second microstructures, wherein:
the first microstructures and the second microstructures include pillars or walls; and
the first microstructures include pillars, and one (1) square millimeter (mm²) surface area of the first conductive layer includes between 2,500 pillars and 10,000 pillars.

2. The microelectronic substrate of claim 1, wherein a thickness of the first microstructures is between 2 microns and 20 microns.

3. The microelectronic substrate of claim 1, wherein a thickness of the high-k dielectric material is between 500 nanometers and 2 microns.

4. The microelectronic substrate of claim 1, wherein the high-k dielectric material includes barium, titanium, and oxygen; strontium, titanium, and oxygen; or lead, zirconium, and titanium.

5. A microelectronic substrate, comprising:

a first conductive layer having first microstructures at a first surface;

a second conductive layer on the first conductive layer, the second conductive layer having second microstructures at a second surface, wherein the second microstructures vertically interlock with the first microstructures; and a high-k dielectric material between the first microstructures and the second microstructures, wherein:

the first microstructures and the second microstructures include pillars or walls; and the first microstructures include pillars, a thickness of the first microstructures is between 5 microns and 15 microns, and a spacing between the first microstructures is between 5 microns and 10 microns.

6. A microelectronic assembly, comprising:

a substrate having a first surface and an opposing second surface;

a capacitor in the substrate adjacent to the second surface, the capacitor including:

a first conductive layer having first microstructures at a surface;

a second conductive layer on the first conductive layer, the second conductive layer having second microstructures at a surface, wherein the second microstructures vertically interlock with the first microstructures; and a high-k dielectric material between the first microstructures and the second microstructures; and a die at the second surface of the substrate and electrically coupled to the capacitor, wherein:

the first microstructures include pillars, and one (1) square millimeter ($mm^2$) surface area of the first conductive layer includes between 2,500 pillars and 10,000 pillars.

7. The microelectronic assembly of claim 6, wherein the first microstructures and the second microstructures include pillars or walls.

8. The microelectronic assembly of claim 6, wherein a thickness of the first microstructures is between 2 microns and 20 microns.

9. The microelectronic assembly of claim 6, wherein a thickness of the high-k dielectric material is between 500 nanometers and 2 microns.

10. The microelectronic assembly of claim 6, wherein the high-k dielectric material includes barium, titanium, and oxygen; strontium, titanium, and oxygen; or lead, zirconium, and titanium.

11. The microelectronic assembly of claim 6, further comprising:

a circuit board electrically coupled to the first surface of the substrate.

12. A microelectronic assembly, comprising:

a substrate having a first surface and an opposing second surface;

a plurality of capacitors in the substrate adjacent to the second surface, the plurality of capacitors including:

a first conductive layer having first microstructures at a surface;

a second conductive layer on the first conductive layer, the second conductive layer having second microstructures at a surface, wherein the second microstructures vertically interlock with the first microstructures; and a high-k dielectric material between the first microstructures and the second microstructures, wherein:

the first microstructures and the second microstructures include pillars or walls; and the first microstructures include pillars, and one (1) square millimeter ($mm^2$) surface area of the first conductive layer includes between 2,500 pillars and 10,000 pillars; and a first die at the second surface of the substrate and electrically coupled to one of the plurality of capacitors; and a second die at the second surface of the substrate and electrically coupled to another one of the plurality of capacitors.

13. The microelectronic assembly of claim 12, wherein a thickness of the first microstructures is between 2 microns and 20 microns.

14. The microelectronic assembly of claim 12, wherein a thickness of the high-k dielectric material is between 500 nanometers and 2 microns.

15. The microelectronic assembly of claim 12, wherein the high-k dielectric material includes barium, titanium, and oxygen; strontium, titanium, and oxygen; or lead, zirconium, and titanium.

16. The microelectronic assembly of claim 12, wherein the plurality of capacitors includes between 20 capacitors and 50 capacitors.

\* \* \* \* \*